(12) United States Patent
Kim et al.

(10) Patent No.: US 8,969,770 B2
(45) Date of Patent: Mar. 3, 2015

(54) CORRELATED DOUBLE SAMPLING TO INCLUDE A CONTROLLER TO INCREMENT AND INVERT A COUNT DURING A FIRST PERIOD AND A SECOND PERIOD

(75) Inventors: Dongsoo Kim, San Jose, CA (US); Sungkuk Hong, Santa Clara, CA (US); Kwangbo Cho, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 535 days.

(21) Appl. No.: 13/226,820

(22) Filed: Sep. 7, 2011

(65) Prior Publication Data
US 2012/0280113 A1 Nov. 8, 2012

Related U.S. Application Data

(60) Provisional application No. 61/481,455, filed on May 2, 2011.

(51) Int. Cl.
| | | |
|---|---|---|
| *H01L 27/00* | (2006.01) | |
| *G01J 1/44* | (2006.01) | |
| *H03K 21/38* | (2006.01) | |
| *H04N 5/357* | (2011.01) | |
| *H04N 5/378* | (2011.01) | |

(52) U.S. Cl.
CPC . *G01J 1/44* (2013.01); *H03K 21/38* (2013.01); *H04N 5/3575* (2013.01); *H04N 5/378* (2013.01)

USPC .................................. 250/208.1; 250/214 R (58) Field of Classification Search
USPC .................... 250/214 R, 214.1, 214 L, 208.1; 348/529–531, 537, 292–311
See application file for complete search history.

(56) References Cited

U.S. PATENT DOCUMENTS

| | | | |
|---|---|---|---|
| 7,525,587 B2 | 4/2009 | Bock | |
| 7,911,519 B2 * | 3/2011 | Saito et al. | .................... 348/294 |
| 8,093,543 B2 * | 1/2012 | Yamaoka et al. | ......... 250/214 R |
| 2010/0194945 A1 | 8/2010 | Chiu | |

OTHER PUBLICATIONS

Lim et al., A High-Speed CMOS Image Sensor With Column-Parallel Two-Step Single-Slope ADCs, IEEE Transactions on Electron Devices, vol. 56, No. 3, Mar. 2009, pp. 393-398.

* cited by examiner

*Primary Examiner* — Georgia Y Epps
*Assistant Examiner* — Don Williams
(74) *Attorney, Agent, or Firm* — Kendall P. Woodruff (57) ABSTRACT

Apparatus and a method for correlated double sampling using an up-counter for parallel image sensors. All bits of a counter are set to one. An offset signal is compared to a first reference signal to define a first period during which the counter is incremented. After the first period, all bits of the counter are inverted. A sensor signal is compared to a second reference signal to define a second period during which the counter is incremented to generate a correlated double sampling value.

13 Claims, 12 Drawing Sheets

FIG. 11C

CORRELATED DOUBLE SAMPLING TO INCLUDE A CONTROLLER TO INCREMENT AND INVERT A COUNT DURING A FIRST PERIOD AND A SECOND PERIOD

CROSS REFERENCE TO RELATED APPLICATIONS

This application claims priority of U.S. Provisional Patent Application Ser. No. 61/481,455, filed May 2, 2011, which is incorporated herein by reference.

FIELD

The subject invention concerns correlated double sampling and in particular using a counter to implement correlated double sampling.

BACKGROUND

Correlated double sampling (CDS) is a technique for measuring sensor values that allows for removal of an undesired offset, for example, switching noise. Such sensor values may correspond to electrical signals such as voltages or currents. The output of a sensor is measured twice. A first measurement is taken in a known condition. A second measurement is taken in an unknown condition. The value measured from the known condition is then subtracted from the value measured in the unknown condition to generate a value with a known relation to the physical quantity being measured.

BRIEF DESCRIPTION OF THE DRAWINGS

For a more complete understanding of the nature and benefits of the invention, reference should be made to the following detailed description taken in conjunction with the accompanying drawings, in which.

DETAILED DESCRIPTION

Figure 1:
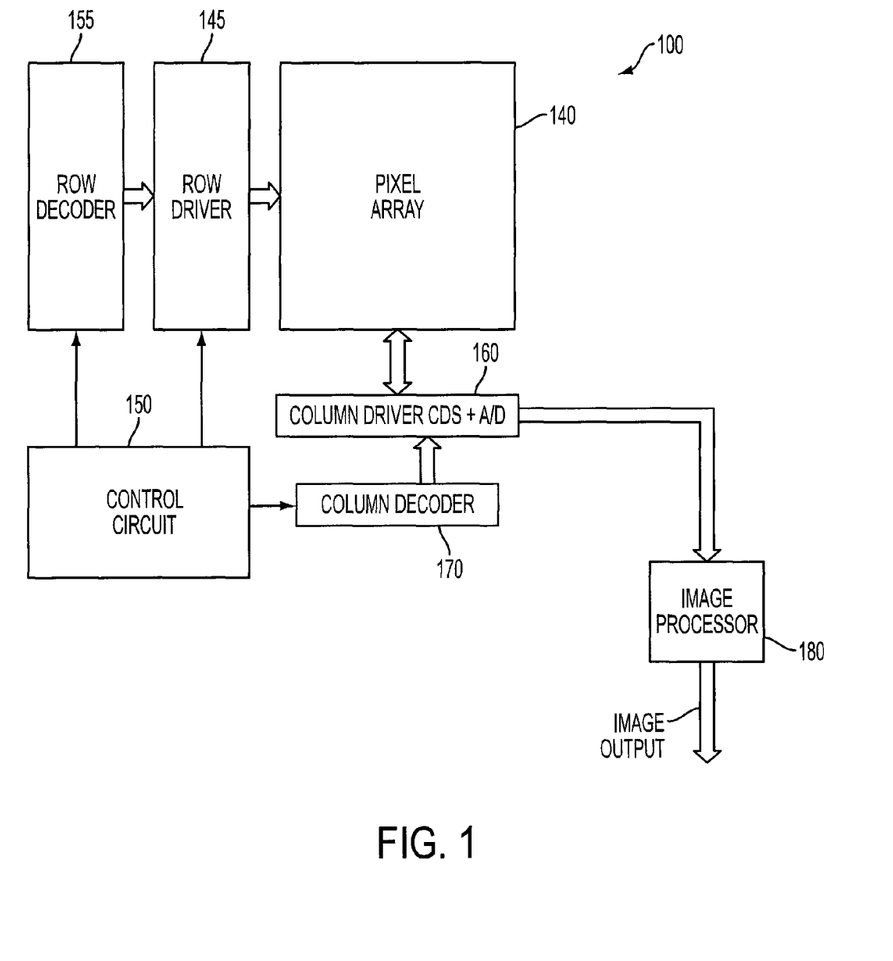
FIG. 1 shows a block diagram of an imager in accordance with an example embodiment of the invention.

There is shown in FIG. 1 an example imaging device 100 having a pixel array 140. Row lines of the array 140 are selectively activated by a row driver 145 in response to row address decoder 155. A column driver 160 and column address decoder 170 are also included in the imaging device 100. The imaging device 100 is operated by the timing and control circuit 150, which controls the address decoders 155, 170. The control circuit 150 also controls the row and column driver circuitry 145, 160.

A correlated double sampling and A/D conversion module 110 ("CDS-A/D module") receives a pixel reset signal and a pixel sensor signal for selected pixels of the array 140. The CDS-A/D module 110 uses the pixel reset signal and pixel sensor signal to generate digitized pixel values corresponding to the selected pixels of the array 140. The digitized pixel values are supplied to an image processor 180 which may form and output a digital image. In the example embodiment shown in FIG. 1, the CDS-A/D module 110 is outside of the pixel array and the imaging device 100 has a "serial conversion" architecture. Embodiments of the invention encompass implementing the methods described below with other types of imaging devices. For example, a CDS-A/D module having a circuit capable of performing the methods described below may be implemented in an imaging device having a "parallel conversion" architecture. In such a system, each column may include a CDS-A/D module that functions in parallel with those of the other columns.

Figure 2:
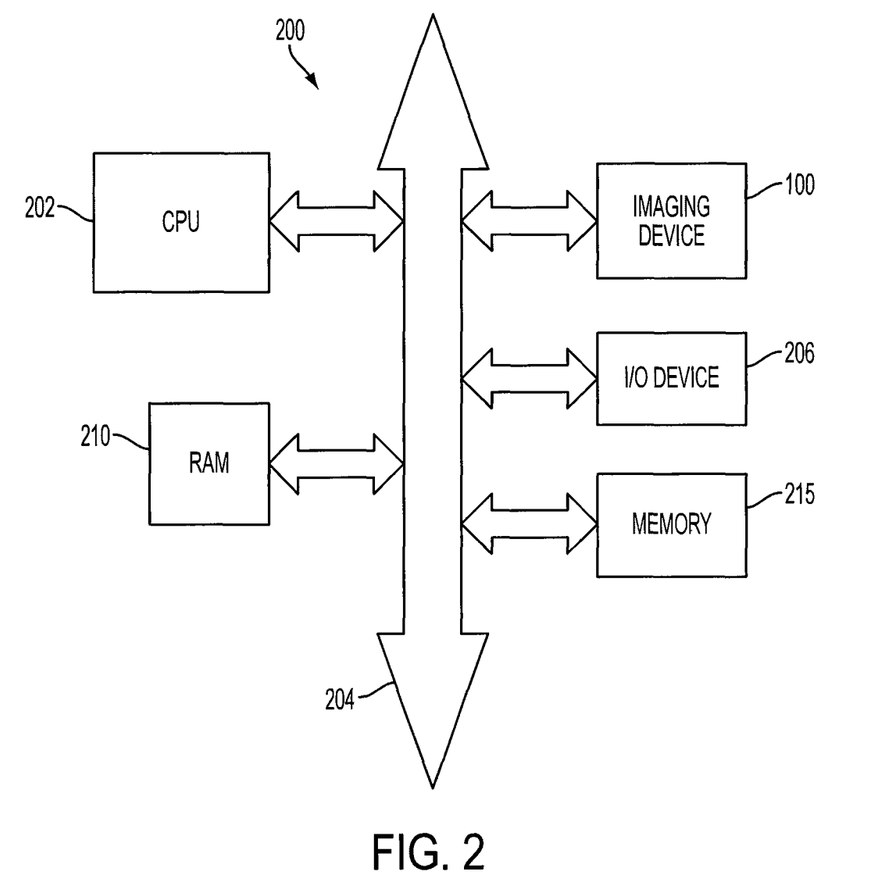
FIG. 2 shows a processor system incorporating at least one imaging device constructed in accordance with an example embodiment of the invention.

FIG. 2 shows system 200, a typical processor system modified to include the imaging device 100 (FIG. 1) of the invention. The system 200 is exemplary of a system having digital circuits that could include image sensor devices. Without being limiting, such a system could include a computer system, still or video camera system, scanner, machine vision, video phone, and auto focus system, or other imager applications.

System 200, for example a camera system, generally comprises a central processing unit (CPU) 202, such as a microprocessor, that communicates with an input/output (I/O) device 206 over a bus 204. Imaging device 100 also communicates with the CPU 202 over the bus 204. The processor-based system 200 also includes random access memory (RAM) 210, and can include non-volatile memory 215, which also communicates with the CPU 202 over the bus 204. The imaging device 100 may be combined with a processor, such as a CPU, digital signal processor, or microprocessor, with or without memory storage on a single integrated circuit or on a different chip than the processor.

Figure 3A:
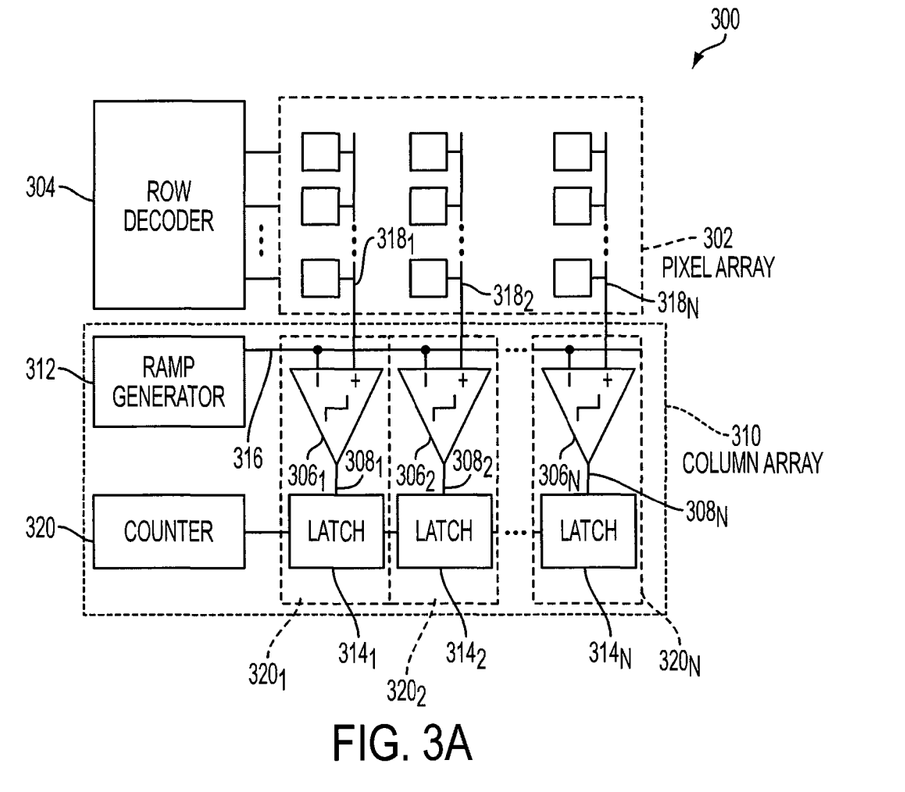
FIG. 3A is a partial block diagram of an imager having a single slope analog-to-digital conversion system.

The CDS-A/D module 110 may include a single slope analog-to-digital conversion system 310 as illustrated in the partial block diagram of an imager 300 shown in FIG. 3A. The imager 300 includes a pixel array 302. Row lines of the pixel array 302 are selectively activated by a row driver 304.

A pixel signal 318 from one column of the pixel array is supplied to one input of a corresponding comparator 306. A ramp generator 312 generates a ramp signal 316 supplied to another input of each comparator 306. The output 308 of each comparator 306 is coupled to a latching module 314 to trigger the latching module 314 to store a pixel value based on a count generated by a counter 320.

Figure 3B:
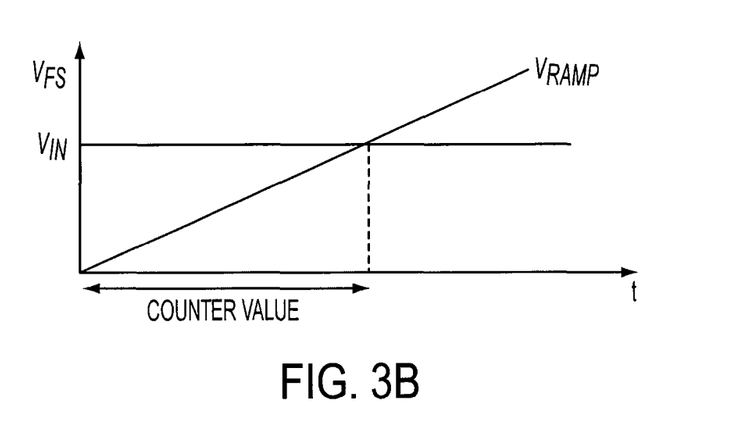
FIG. 3B is a plot of signals corresponding to the block diagram shown in FIG. 3A.

The ramp signal 316 is designated as $V_{RAMP}$ in the plot of signals shown in FIG. 3B. The pixel signal 318 corresponding to one of the columns of the pixel array 302 is designated $V_{IN}$ in FIG. 3B. When the ramp signal $V_{RAMP}$ reaches the value of the signal $V_{IN}$, the output 308 of the comparator 306 triggers the latching module 314 to store the value of the counter 320. As a result, the count stored by each latching module 314 represents the amount of time it took for the $V_{RAMP}$ signal to reach the value of the $V_{IN}$ signal. In other words, the counter value stored by the latching module 314 corresponds to the magnitude of the signal $V_{IN}$.

Figure 4:
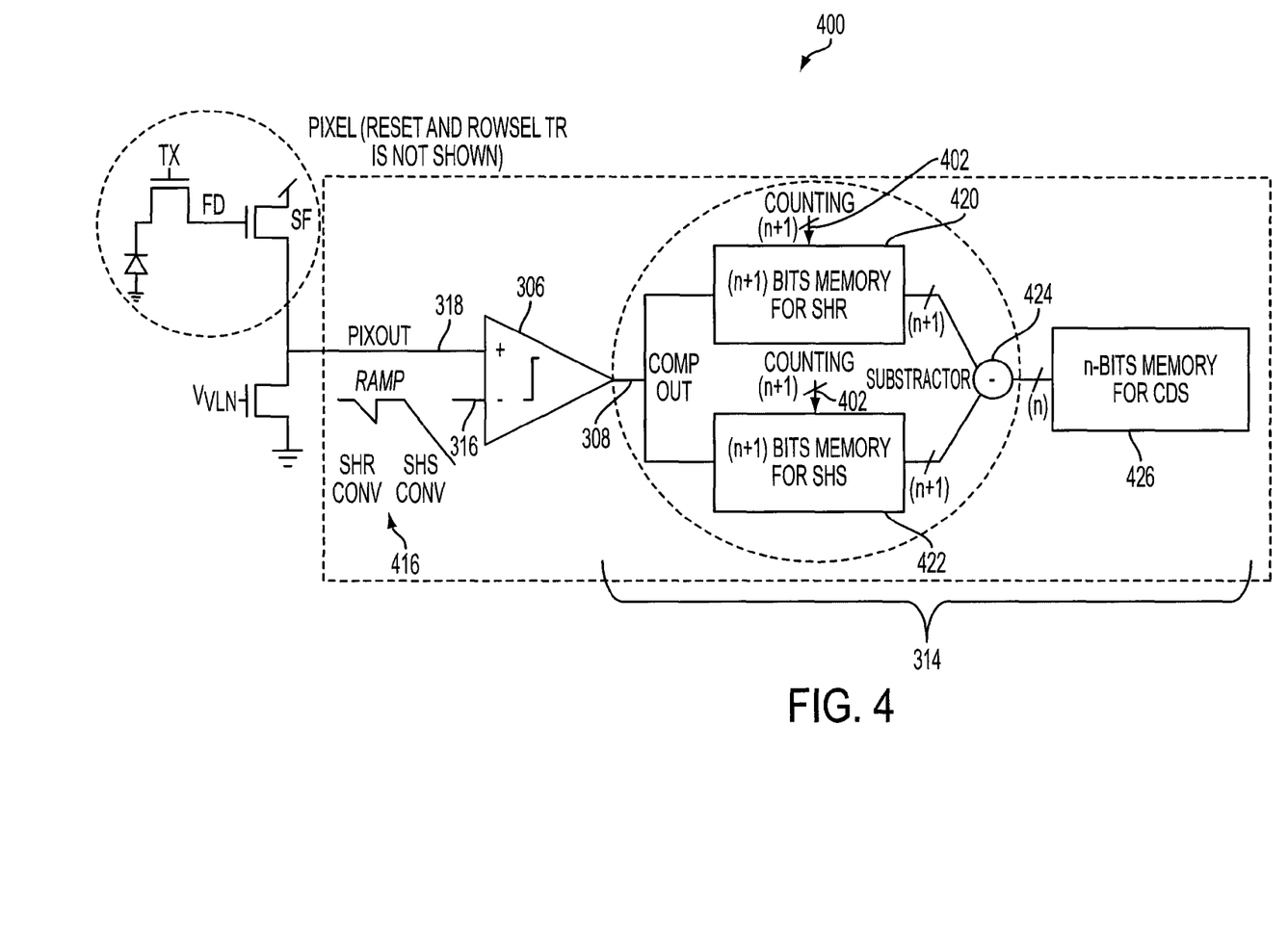
FIG. 4 is a block diagram, partly in schematic diagram form, of a system having separate SHR and SHS memories.

Operation of the system 300 in FIG. 3A for implementing correlated double sampling is described with reference to the block diagram 400 shown in FIG. 4. The diagram 400 in FIG. 4 provides further details regarding the mechanism of the latching module 314 for storing a pixel value. The comparator 306 receives the pixel signal 318 (pixout in FIG. 4) from the pixel array 302 and receives the ramp signal 316 from the ramp generator (not shown in FIG. 4). The ramp signal 316 and the pixel signal 318 are compared by the comparator 306.

The ramp signal 316 generated by the ramp generator has two separate ramp portions as illustrated by the signal 416 in FIG. 4. A first "SHR" ramp portion corresponds to the sample reset signal SHR (or "pixel reset signal") and a second ramp "SHS" portion corresponds to the sample pixel signal SHS (or "pixel sensor signal"). The pixel signal 318 is a pixel reset signal during the first portion of the ramp signal 416 and is a pixel sensor signal during a second portion of the ramp signal 416.

The first and second n+1 bit memories 420, 422 receive a n+1 bit count signal 402 from the counter 320. During a first time period, when the ramp signal 316 corresponds to the pixel reset signal and the pixel reset signal is input to the comparator 306, the first n+1 bit memory 420 is used to store the SHR value of the counter in response to the comparator output signal 308. The counter (shown in FIG. 3) begins counting at the start of SHR ramp. When the pixel reset signal equals the SHR ramp signal, the counter value is stored in the first memory 420.

During a second time period, when the ramp signal 316 corresponds to the pixel sensor signal and the pixel sensor signal is input the comparator 306, the second n+1 bit memory 422 is used to store the SHS value of the counter in response to the comparator output signal 308. The counter (shown in FIG. 3) begins counting at the start of SHS ramp. When the pixel sensor signal equals the SHS ramp signal, the counter value is stored in the second memory 422.

The SHR and SHS values stored in the first and second memories 420, 422 are then subtracted using a subtractor module 424. The difference between the SHR and SHS values is then stored in a n-bit memory 426. The difference value stored in the memory 426 is the value corresponding to one pixel based on correlated double sampling.

Figure 5:
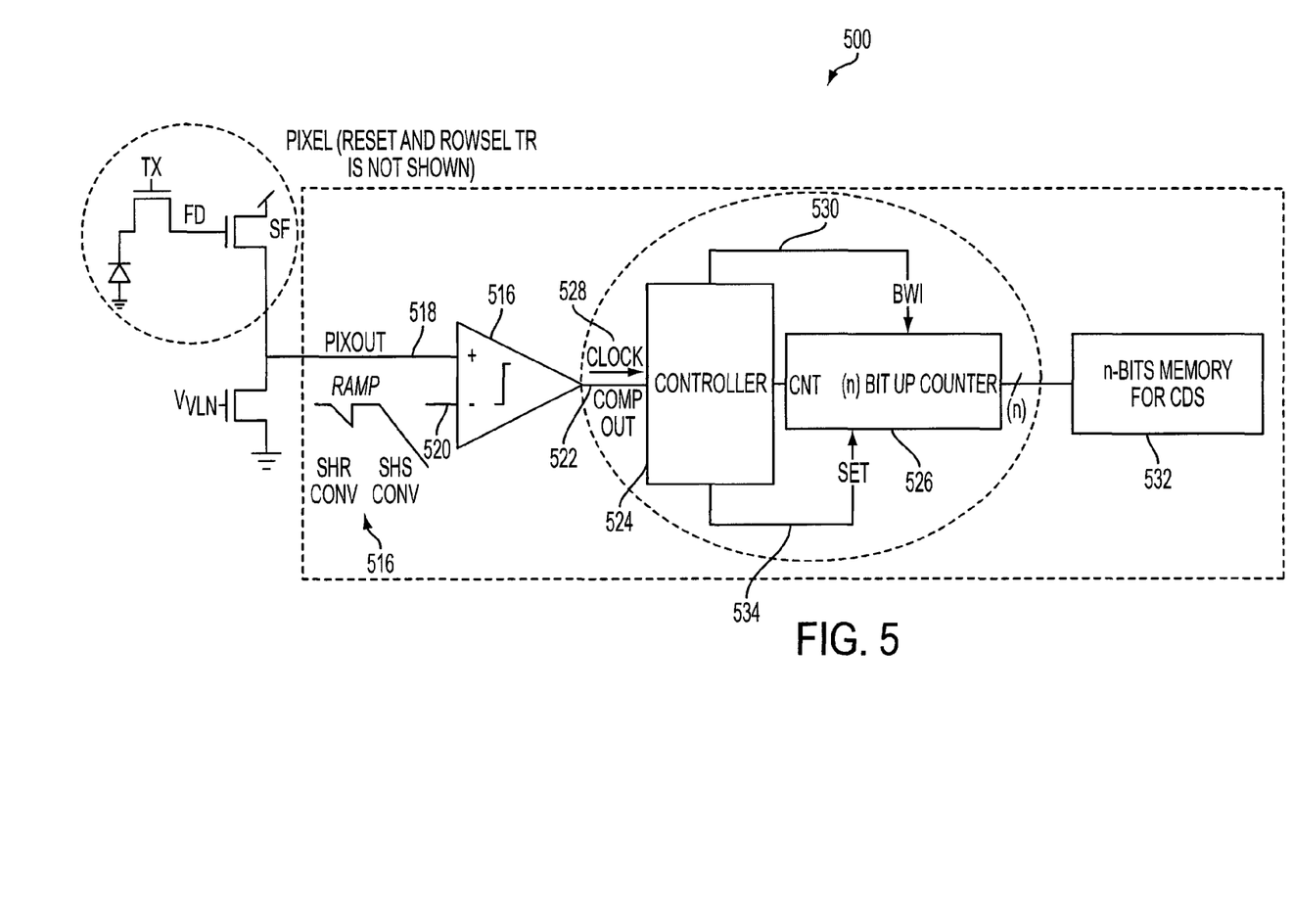
FIG. 5 is a block diagram, partly in schematic diagram form, of a system according to an example embodiment of the invention.

There is shown in FIG. 5 a block diagram of a system 500 according to an example embodiment of the invention. A comparator 516 receives a data signal at one input 518 and receives a reference signal 516 generated by a reference signal generator (not shown) at another input 520. The comparator 516 compares the data signal to the reference signal 516 to generate a difference between the data signal and the reference signal and outputs the difference as a comparator output signal 522. During a first period the data signal is a reset signal or offset signal and during a second period the data signal is a sensor signal. In an example embodiment and as described below with reference to system 500, the data signal is a pixel signal.

As described above with reference to FIG. 4, the system 400 uses two separate memories to store two separate counts corresponding to the pixel reset signal and the pixel sensor signal. A subtractor module then subtracts those counts to provide a desired data value. The system 500 implements correlated double sampling without such memories and subtractor module and instead uses a counter controlled by a controller.

The desired correlated double sampling data value is the difference between a pixel sensor signal value (SHS) and a pixel reset signal value (SHR). The system 500 controls a counter to implement 2's complement arithmetic to generate the data value. The difference of SHS-SHR is generated by setting all bits of a counter to "1" to provide a value of negative one, incrementing a counter by a count corresponding to the value of SHR, inverting all bits of the count to provide the subtraction function, then incrementing the counter by a count corresponding to the value of SHS. This implementation is further described below.

A controller 524 generates a set signal 534 to control the counter 526 to set all bits of the counter 526 to one. The controller 524 then, using a clock signal 528 and the comparator output signal 522, controls the counter to increment the count during a first period. The controller 524 then generates an inversion signal BWI 530 input to the counter 526 to invert all bits of the counter 526. The controller 524 then, using a clock signal 528 and the comparator output signal 522, controls the counter to increment the count during a second period to generate a data value which is stored in a memory 532.

Figure 6:
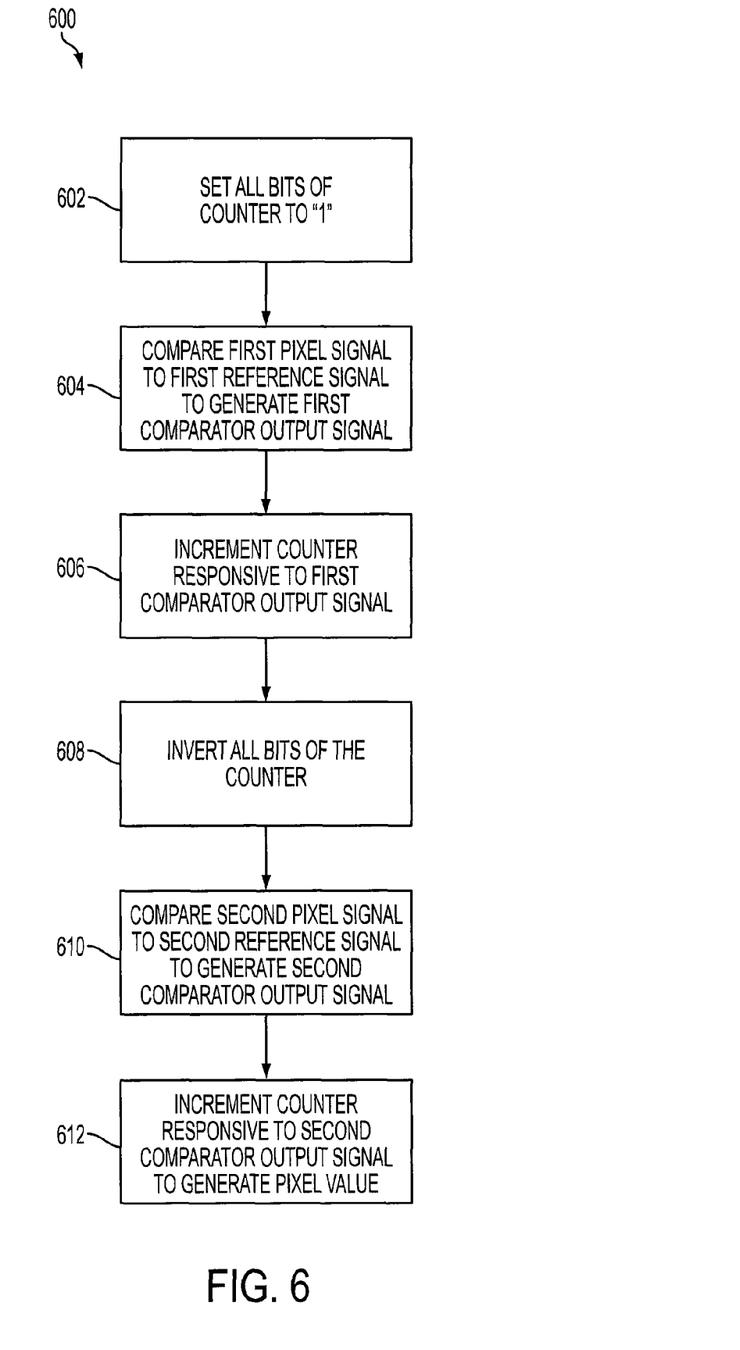
FIG. 6 is a flow chart illustrating a method according to an example embodiment of the invention.

Operation of the system 500 is described with reference to the flow chart 600 in FIG. 6 according to an example embodiment where the data signal 518 is a pixel signal and the reference signal is a ramp signal. Example embodiments encompass having a reference signal that is not a ramp and that may or may not have a linear profile, and may have a positive or negative slope.

The controller 524 generates a set signal 524 input to the counter 526 to set all bits of the counter to "1" in step 602. In step 604, the comparator compares a first pixel signal to a first reference signal to generate a first comparator output signal. The controller 524 controls the counter in step 606 in response to a clock signal 528 and the first comparator output signal 522 to increment the count during a first period responsive to the first comparator output signal. In step 608, the controller 524 generates an inversion signal (BWI) 530 which is input to the counter to invert all the bits of the counter.

In step 610, the comparator compares a second pixel signal to a second reference signal to generate a second comparator output signal. The controller 524 controls the counter in step 612 in response to a clock signal 528 and the second comparator output signal 522 to increment the count during a second period responsive to the comparator output.

Figure 7:
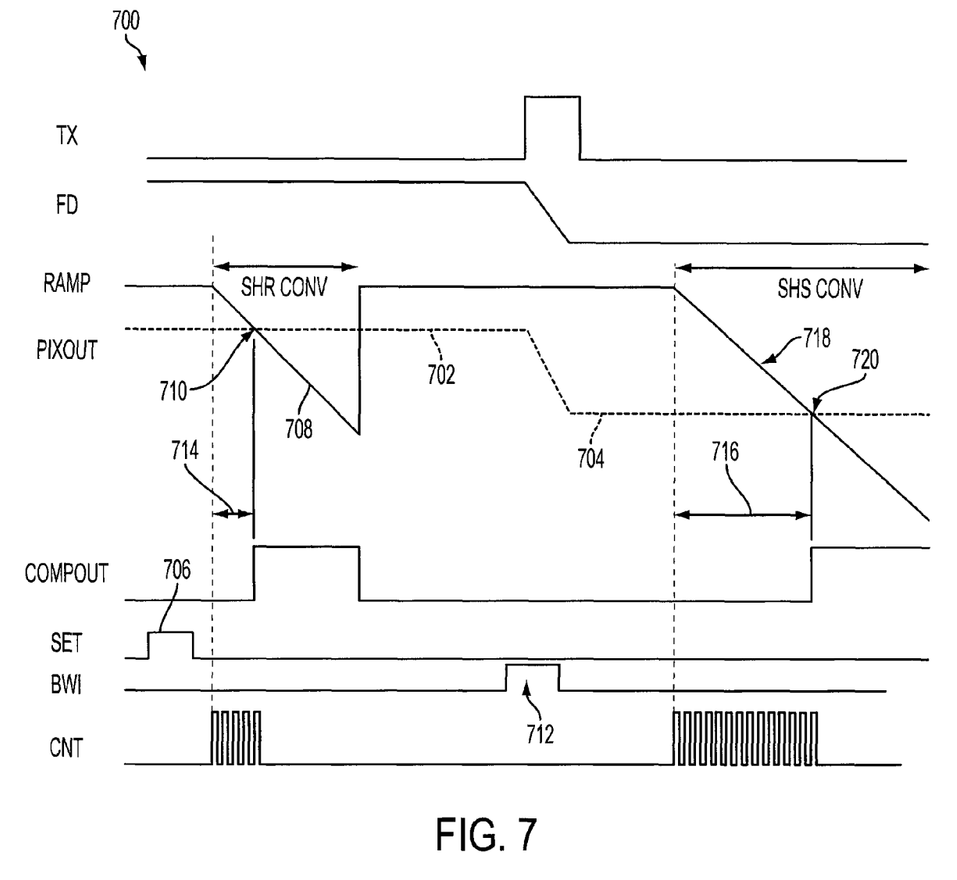
FIGS. 7-8 are timing diagrams corresponding to the block diagram shown in FIG. 5 according to an example embodiment of the invention.

There is shown in FIG. 7 a timing diagram 700 corresponding to the system shown in FIG. 5. The signals TX and FD correspond to the signals shown in FIG. 5 that control the pixel array to generate the pixel reset signal and the pixel sensor signal during first and second time periods, respectively.

The RAMP signal is generated by a ramp generator. The "pixout" signal is the pixel signal and corresponds at one period of time to the pixel reset signal 702 and at another period of time to the pixel sensor signal 704. A pulse 706 of the SET signal sets all bits of the counter 526 to one. The comparator 516 then compares the pixel reset signal 702 to the first reference signal which is a first ramp signal 708 in this example embodiment, and the counter 526 is incremented according to a clocking CNT signal. The CNT signal is generated by the controller 524 in response to a clock signal and the comparator output signal COMPOUT.

When the pixel reset signal 702 equals the reference signal 708 at point 710 in this example embodiment, the comparator output signal COMPOUT goes high. In response to the COMPOUT going high, the controller 524 stops the CNT signal from clocking to stop incrementing the counter 526. The point 710 designates the end of a first period 714 during which the counter 526 is incremented. This process may be repeated in parallel for a plurality of pixels in multiple columns using the same RAMP signal. Therefore, the RAMP signal is shown as continuing even after the point 710 because other counters functioning in parallel may continue counting until the RAMP signal equals the other pixels' pixel reset signal.

The controller 524 then generates a pulse 712 in the bit-wise inversion (BWI) signal which is input to the counter 526 to invert all bits of the counter 526. Then the second period 716 begins with the start of the second reference signal which is a second ramp signal 718 in this example embodiment. The comparator 516 compares the pixel sensor signal 704 to the second ramp signal 718, and the counter is incremented according to a clocking CNT signal. The CNT signal is generated by the controller 524 in response to a clock signal and the comparator output signal COMPOUT.

When the pixel sensor signal 704 equals the second ramp signal 718 at point 720 in this example embodiment, the comparator output signal COMPOUT goes high. In response to the COMPOUT going high, the controller 524 stops the CNT signal from clocking to stop incrementing the counter. The point 720 designates the end of the second period 716 during which the counter 526 is incremented. Similar to the first period, this process may be repeated in parallel for a plurality of pixels in multiple columns using the same RAMP signal. The count is then stored in memory 532.

Figure 8:
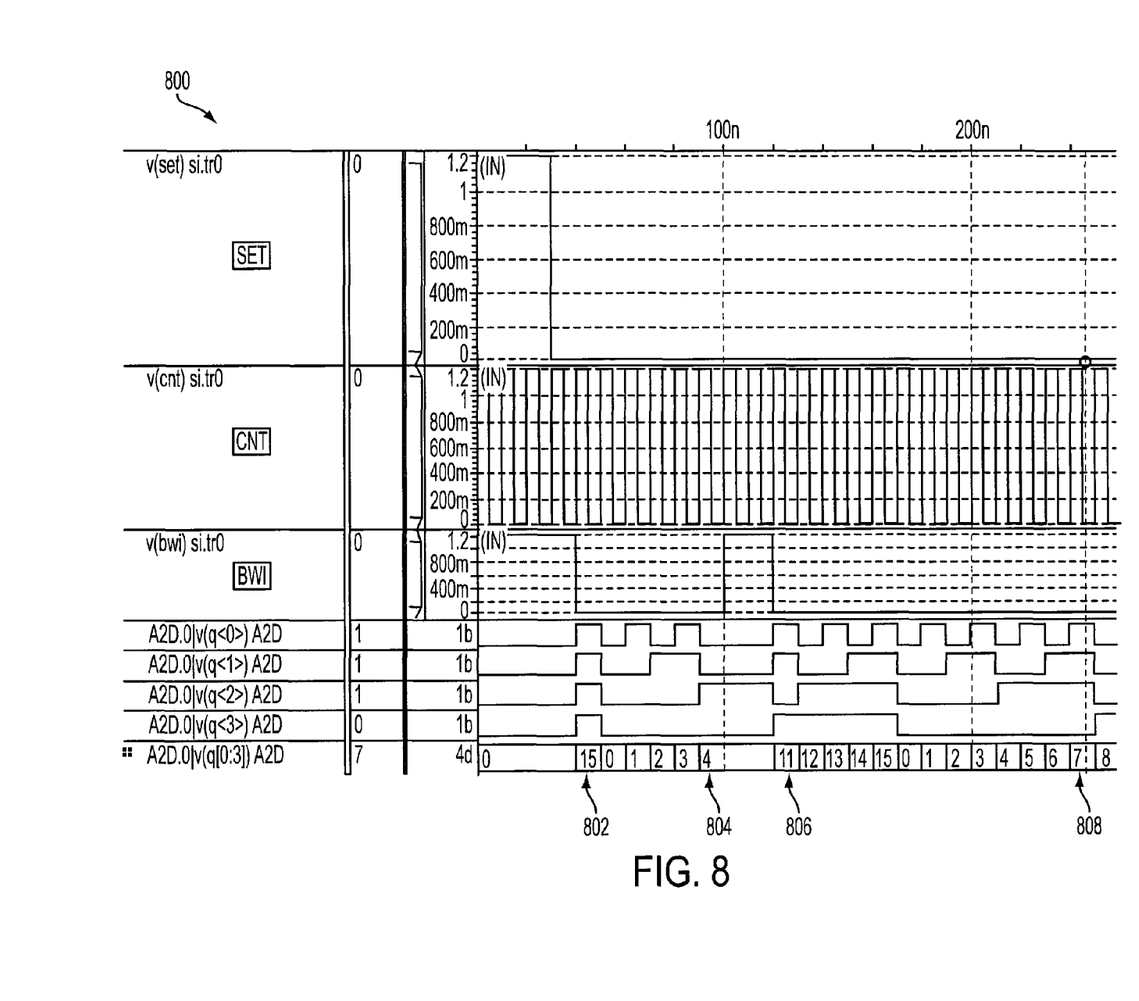

There is shown in FIG. 8 a timing diagram 800 corresponding to the system shown in FIG. 5. The timing diagram 800 corresponds to an example embodiment having a four-bit counter. Embodiments of the invention are not limited to a certain number of bits of a counter. In another example embodiment, a twelve-bit counter is used. The signals in timing diagram 800 do not exactly correspond to the signals in timing diagram 700 and are used for illustration purposes. For example, the clock signal CNT in the timing diagram 800 is shown to be continuous but the counter 526 is controlled by the controller 524 and may be not continuously incremented as described above with reference to timing diagram 700. For example, the controller 524 may couple a continuous clocking signal to the counter 526 only during the first and second periods 714, 716.

In the example embodiment in FIG. 8, the pixel reset signal SHR corresponds to a value of 5 and a pixel sensor signal SHS corresponds to a value of 13. The system 500 provides the desired difference of 13-5 to provide a pixel value of 7.

The SET signal is used to set all bits of the four-bit counter to provide a decimal equivalent of 15 (binary 1111) at position 802. The counter is then incremented during the first period by five steps corresponding to the level of the pixel reset signal SHR to result in a count of four (binary 0010) at position 804 (i.e., when the pixel reset signal equals the first ramp signal).

The bit-wise inversion BWI signal is then pulsed to invert all the bits of the counter which results in the count of 4 (binary 0100) being converted into a count of eleven (binary 1011) at position 806. The counter is then incremented during the second period by thirteen steps corresponding to the level of the pixel sensor signal SHS to result in a count of seven (binary 0111) at position 808 (i.e., when the pixel sensor signal equals the second ramp signal).

Figure 9:
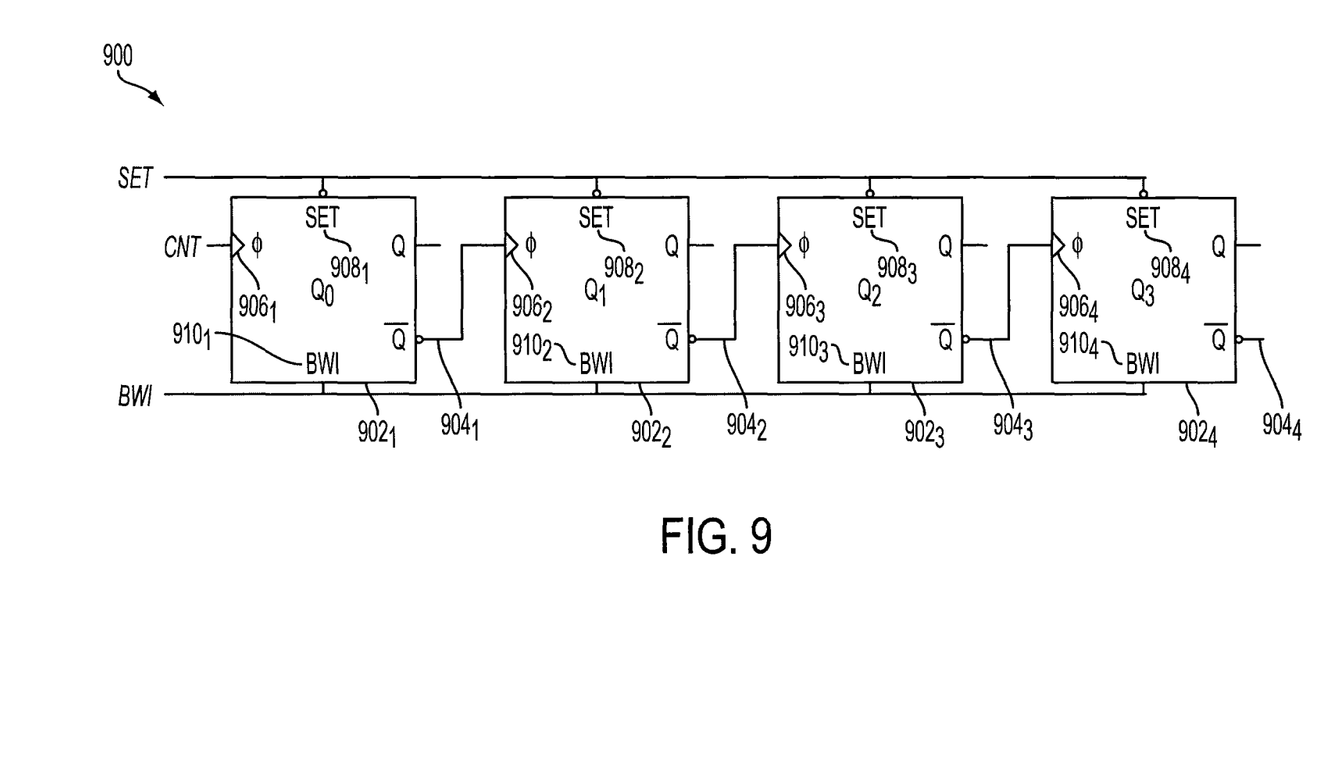
FIG. 9 is a schematic diagram of a counter according to an example embodiment of the invention.

There is shown in FIG. 9 is a block diagram of a four-bit counter 900 according to an example embodiment of the invention that may be used as the counter 526 in the system 500 shown in FIG. 5. The counter 900 has a plurality of modules 902 arranged in a sequence. Each module 902 has a module output 904 and a clock input 906.

The clock input 906 of each module 902 is coupled to the module output 904 of a preceding module in the sequence of modules for the second and subsequent modules in the sequence for form a ripple counter. In other words, clock input $906_i$ is coupled to module output $904_{i-1}$ where "i" designates the position of a module in the sequence. The clock input $906_1$ of the first module $902_1$ is coupled to a clock signal designated CNT.

Each module 902 includes a set signal input 908. A signal may be applied to the set signal input 908 of the modules 902 to set (e.g., to "1") the output of all the modules 902. Each module 902 includes a bit-wise inversion BWI input 908. A signal may be applied to the BWI input 908 of the modules 902 to invert the module output 904 of all the modules 902.

Figure 10A:
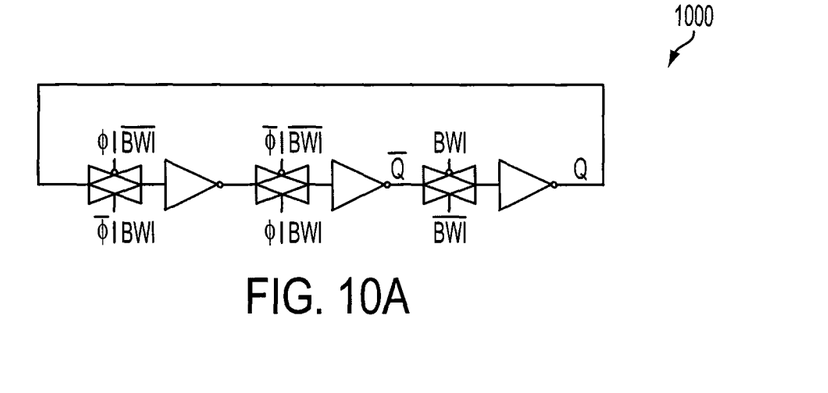
FIG. 10A is a schematic diagram of a counter according to an example embodiment of the invention.
Figure 10B:
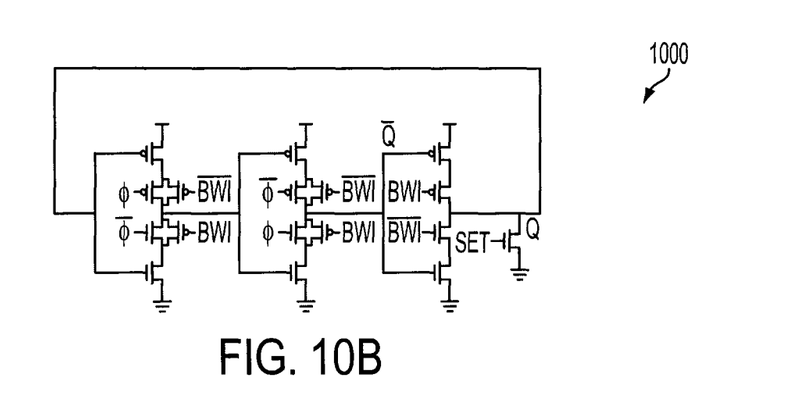
FIGS. 10B-D are schematic diagrams of a counter according to an example embodiment of the invention.

In an example embodiment, the counter is implemented using CMOS technology. In another example embodiment, the counter is implemented using $C^2MOS$ technology to reduce power consumption because $C^2MOS$ circuits do not have a short circuit current. There is shown in FIG. 10A a block diagram of a counter module 1000 using $C^2MOS$ technology according to an example embodiment of the invention. The counter module 1000 is corresponds to a single unit or bit of a counter that may be coupled to multiple additional modules to form a multiple bit counter. A schematic diagram of the counter 1000 is shown in FIG. 10B. The counter 1000 is shown to have 17 transistors for each bit of the counter.

Figure 10C:
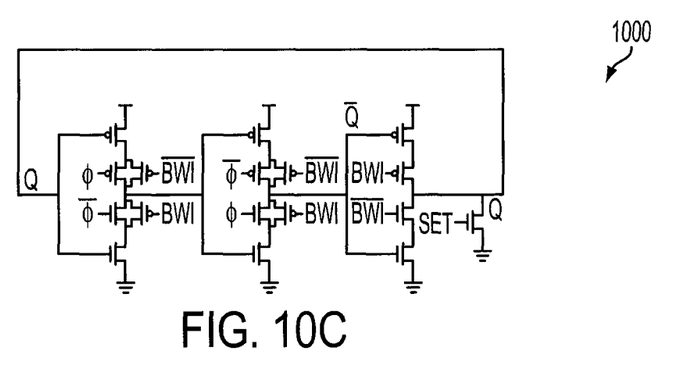
Figure 10D:
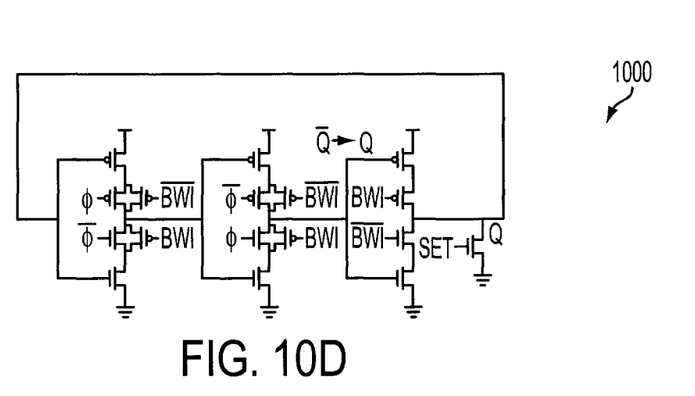

A schematic diagram of the counter 1000 is shown in FIG. 10C in a the counting mode where the count is incremented with certain transistors shown in phantom to highlight the active transistors in the counting mode. A schematic diagram of the counter 1000 is shown in FIG. 10D in a the bit-wise inversion BWI mode where all the bits are inverted with certain transistors shown in phantom to highlight the active transistors in the BWI mode.

Figure 11A:
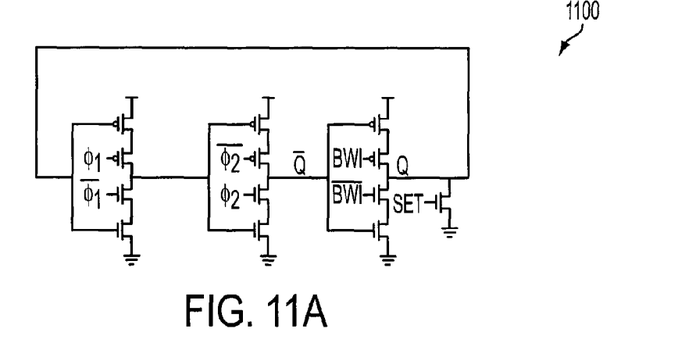
FIGS. 11A-11C are schematic diagrams of a counter according to an example embodiment of the invention.
Figure 11B:
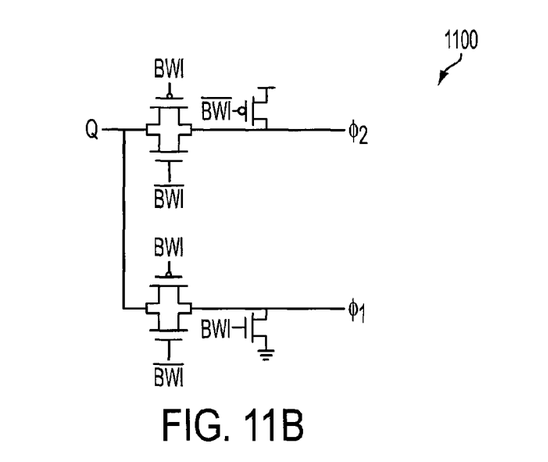
Figure 11C:
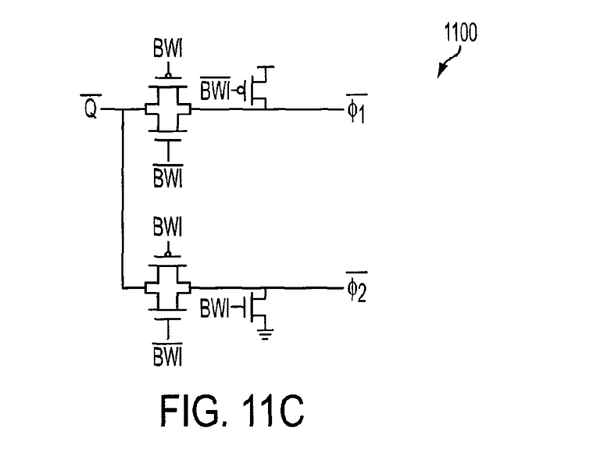

There is shown in FIG. 11A a schematic diagram of a counter module 1100 according to another example embodiment of the invention. The counter module 1100 corresponds to a single unit or bit of a counter that may be coupled to multiple additional modules to form a multiple bit counter. The schematic diagrams shown in FIGS. 11B-C illustrate example schematics for generating the counter control signals $\Phi_1$ and $\Phi_2$.

In one aspect, the invention comprises a method for correlated double sampling. All bits of a counter are set. An offset signal is compared to a first reference signal to define a first period. The counter is incremented during the first period. All bits of the counter are inverted after the first period. A data signal is compared to a second reference signal to define a second period. The counter is incremented during the second period to generate a data value.

In another aspect, the invention comprises a system for processing image data. A comparator has a pixel signal input for receiving a pixel signal and a reference signal input for receiving a reference signal, for generating a comparator output. A counter generates a count. A controller controls the counter to set the count to all ones, increment the count during a first period responsive to the comparator output, invert all bits of the count, and increment the count during a second period responsive to the comparator output to generate a pixel value.

According to yet another aspect, the invention comprises a counter having a plurality of modules arranged in a sequence. Each module comprises a module output, a clock input, and a set signal input. The clock input of the second and subsequent modules in the sequence is coupled to the module output of the preceding module in the sequence of modules. A set signal applied to the set signal input sets all the module outputs to 1.

An inversion signal applied to the inversion signal input inverts all the module outputs.

Although the invention is illustrated and described herein with reference to specific embodiments, the invention is not intended to be limited to the details shown. Rather, various modifications may be made in the details within the scope and range of equivalents of the claims and without departing from the invention. Although the method claims may list steps in a particular order, the scope of a method claim is not limited to a particular order of claimed steps unless the language of the method claims imposes a specific order on the performance of the steps.

What is claimed:

1. A method for correlated double sampling comprising:
   setting all bits of a counter;
   comparing an offset signal to a first reference signal to define a first period;
   incrementing the counter during the first period;
   inverting all bits of the counter after the first period;
   comparing a sensor signal to a second reference signal to define a second period; and
   incrementing the counter during the second period to generate a data value.

2. The method according to claim 1 further including generating the first reference signal and the second reference signal from a single source.

3. The method according to claim 1 wherein the first reference signal has a first ramp during the first period and the second reference signal has a second ramp during the second period.

4. The method according to claim 1 comprising
   generating a first comparator output signal based on the comparison of the offset signal to the first reference signal wherein the counter is incremented during the first period responsive to the first comparator output signal; and
   generating a second comparator output signal based on the comparison of the sensor signal to the second reference signal wherein the counter is incremented during the second period responsive to the second comparator output signal.

5. The method according to claim 4 wherein a single comparator generates the first comparator output signal and the second comparator output signal and the method comprises:
   coupling the offset signal and the first reference signal to first and second inputs of the comparator, respectively, during the first period; and
   coupling the sensor signal and the second reference signal to the first and second inputs of the comparator, respectively, during the second period.

6. The method according to claim 5 wherein the offset signal is a pixel reset signal, the sensor signal is a pixel sensor signal, and the data value is a pixel value.

7. The method according to claim 6 wherein the counter is incremented responsive to the first comparator output signal by incrementing the counter until the pixel reset signal equals the first reference signal.

8. The method according to claim 6 wherein the counter is incremented responsive to the second comparator output signal by incrementing the counter until the pixel sensor signal equals the second reference signal.

9. The method according to claim 6 comprising storing the pixel value in a memory.

10. A system for processing image data comprising:
    a comparator having a pixel signal input for receiving a pixel signal and a reference signal input for receiving a reference signal, for generating a comparator output;
    a counter for generating a count;
    a controller for controlling the counter to set the count to all ones, increment the count during a first period responsive to the comparator output, invert all bits of the count, and increment the count during a second period responsive to the comparator output to generate a pixel value; and
    a pixel signal generator for generating the pixel signal including a pixel reset signal during the first period and a pixel sensor signal during the second period.

11. The system according to claim 10 comprising a memory for storing the pixel value.

12. The system according to claim 10 comprising a reference signal generator for generating the reference signal having a first ramp portion during the first period and a second ramp portion during the second period.

13. A counter having a plurality of modules arranged in a sequence, each module comprising:
    a module output;
    a clock input wherein the clock input is connected to the module output of a preceding module in the sequence of modules for the second and subsequent modules in the sequence;
    a set signal input for setting all the module outputs to 1 in response to a set signal; and
    an inversion signal input for inverting all the module outputs in response to an inversion signal.

* * * * *